US009123721B2

(12) United States Patent
Samadi et al.

(10) Patent No.: US 9,123,721 B2
(45) Date of Patent: Sep. 1, 2015

(54) PLACEMENT OF MONOLITHIC INTER-TIER VIAS (MIVS) WITHIN MONOLITHIC THREE DIMENSIONAL (3D) INTEGRATED CIRCUITS (ICS) (3DICS) USING CLUSTERING TO INCREASE USABLE WHITESPACE

(71) Applicant: QUALCOMM Incorporated, San Diego, CA (US)

(72) Inventors: Kambiz Samadi, San Diego, CA (US); Shreepad Amar Panth, Atlanta, GA (US); Pratyush Kamal, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/132,098

(22) Filed: Dec. 18, 2013

(65) Prior Publication Data

US 2015/0145143 A1 May 28, 2015

Related U.S. Application Data

(60) Provisional application No. 61/907,413, filed on Nov. 22, 2013.

(51) Int. Cl.
*H01L 21/768* (2006.01)
*H01L 23/522* (2006.01)
*G06F 17/50* (2006.01)

(52) U.S. Cl.
CPC ........ *H01L 23/5226* (2013.01); *G06F 17/5072* (2013.01)

(58) Field of Classification Search
USPC ......... 438/109, 629, 630, 637–640, 668, 672, 438/675, FOR. 368, FOR. 426, 618, 106, 438/401, 667; 257/E27.026, E21.577, 257/E21.578, E21.585–E21.588, E21.597, 257/E23.011, E23.067, E27.027
See application file for complete search history.

(56) References Cited

U.S. PATENT DOCUMENTS

| | | | |
|---|---|---|---|
| 8,115,511 B2 * | 2/2012 | Or-Bach | 326/39 |
| 8,373,230 B1 | 2/2013 | Or-Bach et al. | |
| 8,803,206 B1 * | 8/2014 | Or-Bach et al. | 257/278 |
| 2014/0040532 A1 * | 2/2014 | Watanabe et al. | 711/103 |
| 2014/0253196 A1 * | 9/2014 | Du et al. | 327/202 |
| 2014/0269022 A1 * | 9/2014 | Xie et al. | 365/154 |

OTHER PUBLICATIONS

Luo G., "Placement and Design Planning for 3D Integrated Circuits," ProQuest LLC., 2011, 185 pages.
Panth S., et al., "High-Density Integration of Functional Modules Using Monolithic 3D-IC Technology," 2013, 32 slides.

* cited by examiner

*Primary Examiner* — Jasmine Clark
(74) *Attorney, Agent, or Firm* — Withrow & Terranova, PLLC

(57) ABSTRACT

Placement of Monolithic Inter-tier Vias (MIVs) within monolithic three dimensional (3D) integrated circuits (ICs) (3DICs) using clustering to increase usable whitespace is disclosed. In one embodiment, a method of placing MIVs in a monolithic 3DIC using clustering is provided. The method comprises determining if any MIV placement clusters are included within a plurality of initial MIV placements of a plurality of MIVs within an initial 3DIC layout plan. The method further comprises aligning each MIV of the plurality of MIVs within each MIV placement cluster in the initial 3DIC layout plan at a final MIV placement for each MIV placement cluster to provide a clustered 3DIC layout plan.

15 Claims, 9 Drawing Sheets

PLACEMENT OF MONOLITHIC INTER-TIER VIAS (MIVS) WITHIN MONOLITHIC THREE DIMENSIONAL (3D) INTEGRATED CIRCUITS (ICS) (3DICS) USING CLUSTERING TO INCREASE USABLE WHITESPACE

PRIORITY APPLICATION

The present application claims priority to U.S. Provisional Patent Application Ser. No. 61/907,413 filed Nov. 22, 2013, and entitled "PLACEMENT OF MONOLITHIC INTER-TIER VIAS (MIVs) WITHIN MONOLITHIC THREE DIMENSIONAL (3D) INTEGRATED CIRCUITS (ICs) (3DICs) USING CLUSTERING TO INCREASE USABLE WHITESPACE," which is hereby incorporated herein by reference in its entirety.

BACKGROUND

I. Field of the Disclosure

The technology of the disclosure relates generally to monolithic three dimensional (3D) integrated circuits (ICs) (3DICs).

II. Background

Mobile communication devices have become common in contemporary society. The prevalence of these mobile devices is driven in part by the many functions that are now enabled on such devices. Demand for such functions increases processing capability requirements of mobile devices and generates a need for more powerful batteries. Within the limited space of the housing of a mobile communication device, batteries compete with the processing circuitry. The limited space contributes pressure to a continued miniaturization of components and power consumption within the circuitry. While miniaturization has been of particular concern in the integrated circuits (ICs) of mobile communication devices, efforts at miniaturization of ICs in other devices have also proceeded.

Historically, elements within an IC have all been placed in a single two dimensional (2D) active layer with elements interconnected through one or more metal layers that are also within the IC. Efforts to miniaturize are reaching their limits in a 2D space and thus, design thoughts have moved to three dimensions. While there have been previous efforts to connect two or more ICs through a separate set of metal layers outside the IC proper, that solution is not a properly three dimensional (3D) approach. In past efforts, two ICs have been stacked one atop another with connections made between the two ICs through solder bumps (i.e., the so called "flip chip" format). Likewise, there are system in package (SIP) solutions that stack ICs atop one another with connections made between the chips with Through Silicon Vias (TSVs). More specifically, TSVs allow vertical stacking of multiple dies that are individually fabricated. However, the quality of TSV-based 3DICs strongly depends on the TSV dimensions and parasitics, which are limited to memory-on-logic or large logic-on-logic designs with a relatively small number of die-to-die interconnects. Further, while the flip chip and TSV embodiments arguably represent 3D solutions, the amount of space required to effectuate a flip chip remains large. Likewise, the space required to implement a TSV relative to the overall size of the chip becomes space prohibitive.

In response to the difficulties in effectuating small ICs that meet miniaturization goals, industry has introduced monolithic 3DICs. Monolithic 3DICs offer vertical stacking of devices (including logic circuits) on a single die, with the potential to significantly reduce die area and increase die performance. More specifically, monolithic 3DICs involve building electronic components and their connections within multiple tiers on a single die. Connections between the tiers within the die are made with Monolithic Inter-tier Vias (MIVs). Such MIVs are much smaller in size than the previously described TSVs, thus allowing 3DICs using MIVs to achieve an integration density that is orders of magnitude higher than 3DICs employing TSVs.

Although monolithic 3DICs have the potential to reduce die area while increasing die performance, current monolithic 3DIC design methodologies are limited to modified versions of 2D block-level integration. More specifically, commercial 2D place and route (P&R) tool flows customized for 3DICs are employed for 3D P&R processes. Using existing 2D P&R tools with 3DIC customizations in this manner places MIVs throughout otherwise usable whitespace within a layout design. This scattered placement of MIVs can result in inefficient occupation of otherwise usable whitespace within the monolithic 3DIC. Such inefficient use of the whitespace in a monolithic 3DIC can prevent the 3DIC from maximizing achievable performance. More specifically, inefficient use of the whitespace can impair optimized use of other components, such as, for example, buffer insertion used to achieve timing optimization. Thus, it would be advantageous to design monolithic 3DICs in a manner that more efficiently uses the whitespace in the 3DIC so as optimize the use of other components within the 3DIC.

SUMMARY OF THE DISCLOSURE

Embodiments disclosed in the detailed description include placement of Monolithic Inter-tier Vias (MIVs) within monolithic three dimensional (3D) integrated circuits (ICs) (3DICs) using clustering to increase usable whitespace. As opposed to methods of placing MIVs within monolithic 3DICs (also referred to herein as a "3DIC" or "3DICs") that scatter the MIVs across a layout design and limit the amount of usable whitespace available in the 3DIC, embodiments disclosed herein strategically place the MIVs within monolithic 3DICs in a manner so as to optimize the usable whitespace in the 3DIC. More specifically, such a placement method includes analyzing initial MIV placements within a 3DIC layout plan to determine whether the MIVs can be grouped into clusters based on their positions relative to one another. Once such clusters are determined, the MIVs within each cluster are aligned so that each MIV is placed at a final position within its cluster so as to increase the usable whitespace available to other components. Because placement of MIVs using clustering results in a greater amount of usable whitespace for other components, the overall performance of monolithic 3DICs can be improved.

In this regard in one embodiment, a method of placing MIVs in a monolithic 3DIC using clustering is provided. The method comprises determining if any MIV placement clusters are included within a plurality of initial MIV placements of a plurality of MIVs within an initial 3DIC layout plan. The method further comprises aligning each MIV of the plurality of MIVs within each MIV placement cluster in the initial 3DIC layout plan at a final MIV placement for each MIV placement cluster to provide a clustered 3DIC layout plan.

In another embodiment, a monolithic 3DIC is provided. The monolithic 3DIC comprises a plurality of IC tiers and a plurality of IC blocks each disposed in an IC tier among the plurality of IC tiers. As non-limiting examples, each IC block may be comprised of one or more logic circuits or functions, one or more IC gates, or one or more standard cells. In this regard, as a non-limiting example, a standard cell may be comprised of one or more IC gates, or other circuits. The monolithic 3DIC further comprises a plurality of MIVs disposed across at least two IC tiers among the plurality of IC tiers to interconnect at least two IC blocks among the plurality of IC blocks, wherein at least ten percent (10%) of the plurality of MIVs comprises at least two MIVs aligned within a 2D section of the monolithic 3DIC.

In another embodiment, a monolithic 3DIC is provided. The monolithic 3DIC comprises a plurality of IC tiers and a plurality of IC blocks each disposed in an IC tier among the plurality of IC tiers. As non-limiting examples, each IC block may be comprised of one or more logic circuits or functions, one or more IC gates, or one or more standard cells. In this regard, as a non-limiting example, a standard cell may be comprised of one or more IC gates, or other circuits. The monolithic 3DIC further comprises a plurality of MIVs disposed across at least two IC tiers among the plurality of IC tiers to interconnect at least two IC blocks among the plurality of IC blocks. The monolithic 3DIC also comprises at least two MIV placement clusters, wherein the plurality of MIVs within the at least two MIV placement clusters are placed so that at least three 2D sections within the monolithic 3DIC have aligned MIVs.

DETAILED DESCRIPTION

Figure 1:
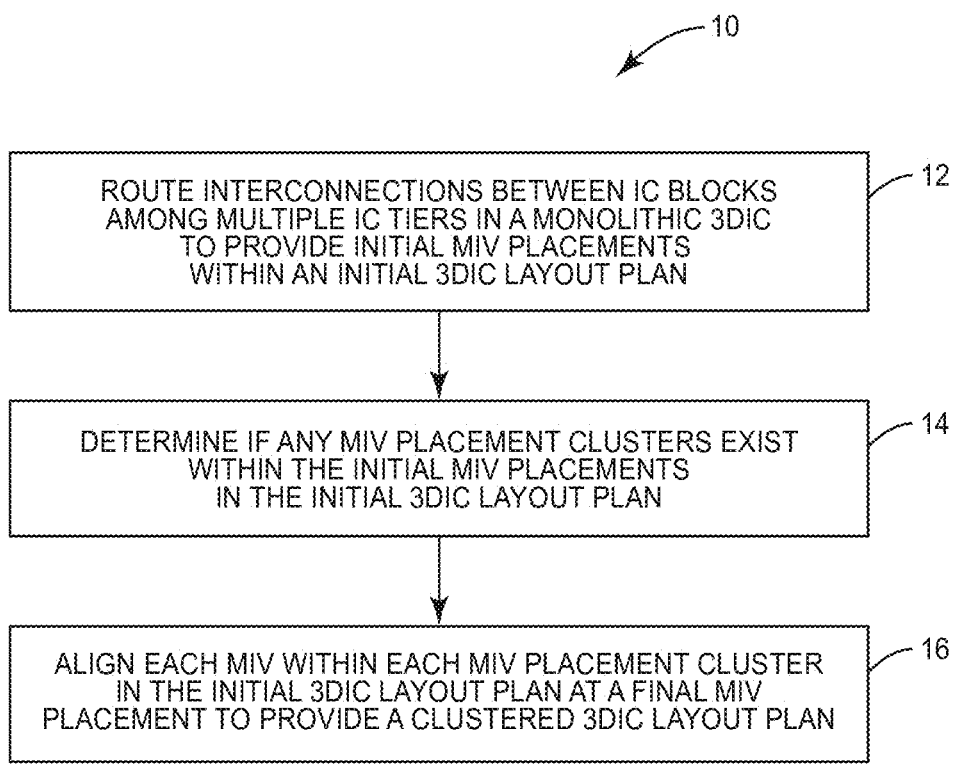
FIG. 1 is a flowchart illustrating an exemplary method for grouping Monolithic Inter-tier Vias (MIVs) within a monolithic three dimensional (3D) integrated circuit (IC) (3DIC) into MIV placement clusters and aligning the MIVs within the MIV placement clusters.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include placement of Monolithic Inter-tier Vias (MIVs) within monolithic three dimensional (3D) integrated circuits (ICs) (3DICs) using clustering to increase usable whitespace. As opposed to methods of placing MIVs within monolithic 3DICs (also referred to herein as a "3DIC" or "3DICs") that scatter the MIVs across a layout design and limit the amount of usable whitespace available in the 3DIC, embodiments disclosed herein strategically place the MIVs within monolithic 3DICs in a manner so as to optimize the usable whitespace in the 3DIC. More specifically, such a placement method includes analyzing initial MIV placements within a 3DIC layout plan to determine whether the MIVs can be grouped into clusters based on their positions relative to one another. Once such clusters are determined, the MIVs within each cluster are aligned so that each MIV is placed at a final position within its cluster so as to increase the usable whitespace available to other components. Because placement of MIVs using clustering results in a greater amount of usable whitespace for other components, the overall performance, power consumption, and routing quality of monolithic 3DICs can be improved.

In this regard, in one embodiment, a method of placing MIVs in a monolithic 3DIC using clustering is provided. The method comprises determining if any MIV placement clusters are included within a plurality of initial MIV placements of a plurality of MIVs within an initial 3DIC layout plan. The method further comprises aligning each MIV of the plurality of MIVs within each MIV placement cluster in the initial 3DIC layout plan at a final MIV placement for each MIV placement cluster to provide a clustered 3DIC layout plan.

Prior to discussing details of the placement of MIVs in a monolithic 3DIC using clustering disclosed herein, it is noted that references to the placement of MIVs within a 3DIC layout plan or layout design are analogous to references to the placement of MIVs within a 3DIC. This is because an MIV placed within the 3DIC layout plan or layout design is similarly placed within the 3DIC during fabrication. Further, as previously described, a monolithic 3DIC is comprised of multiple IC tiers on a single semiconductor die. Additionally, a given IC tier within a monolithic 3DIC may include IC blocks, wherein an IC block existing on one IC tier may be interconnected to an IC block existing on another IC tier by way of an MIV. As non-limiting examples, each IC block may be comprised of one or more logic circuits or functions, one or more IC gates, or one or more standard cells. In this regard, as a non-limiting example, a standard cell may be comprised of one or more IC gates, or other circuits.

In this regard, FIG. 1 is a flowchart illustrating an exemplary method 10 of placing MIVs in a monolithic 3DIC using clustering. Generally, the method 10 comprises grouping MIVs that have initial placements within a 3DIC into MIV placement clusters and aligning the MIVs within such MIV placement clusters so as to increase usable whitespace within the 3DIC. As described in more detail below, a two dimensional (2D) place and route (P&R) tool performs 3D placement and routing of the 3DIC prior to clustering the MIVs. In particular, the 2D P&R tool uses 3D customizations to route interconnections between IC blocks among multiple IC tiers in a monolithic 3DIC (block 12). Using the 2D P&R tool to route such interconnections provides initial MIV placements within an initial 3DIC layout plan. Such initial MIV placements are used to create an initial 3DIC layout plan. While this embodiment creates the initial 3DIC layout plan using the 2D P&R tool provided in block 12, other embodiments may use different processes to create the initial 3DIC layout plan.

With continuing reference to FIG. 1, once the initial MIV placements are provided in block 12, a determination is made as to whether any MIV placement clusters exist within the initial MIV placements in the initial 3DIC layout plan (block 14). As a non-limiting example, such a determination can be made by scanning the initial MIV placements and grouping the MIVs that are initially placed within a certain radius into a particular MIV placement cluster. For example, such a process may include scanning the initial MIV placements and grouping the MIVs within a radius of twenty (20) transistor gate pitches into a particular MIV placement cluster. Once the MIVs are grouped into each respective MIV placement cluster, each MIV is aligned within each MIV placement cluster in the initial 3DIC layout plan at a final MIV placement to provide a clustered 3DIC layout plan (block 16). Such an alignment process produces a clustered 3DIC layout plan with more usable whitespace as compared to the amount of usable whitespace in the initial 3DIC layout plan provided in block 12. However, the method 10 may produce varying results based on the particular 3DIC. For example, the method 10 may result in ten percent (10%) of the MIVs within a 3DIC being aligned in groups of two (2) within a 2D section of the 3DIC. A 2D section may comprise, for example, a standard cell row or column within the 3DIC. Additionally, the method 10 may result in a 3DIC wherein MIVs within two (2) or more MIV placement clusters are grouped and aligned so that at least three (3) 2D sections within the 3DIC contain aligned MIVs. Further, the clustering and alignment described in blocks 14 and 16, respectively, may be performed using multiple iterations for a single 3DIC in order to achieve potentially greater efficiency of MIV placement. In this manner, having a greater amount of usable whitespace available for other components can improve the overall performance, power consumption, and routing quality of the monolithic 3DIC.

Figure 2:
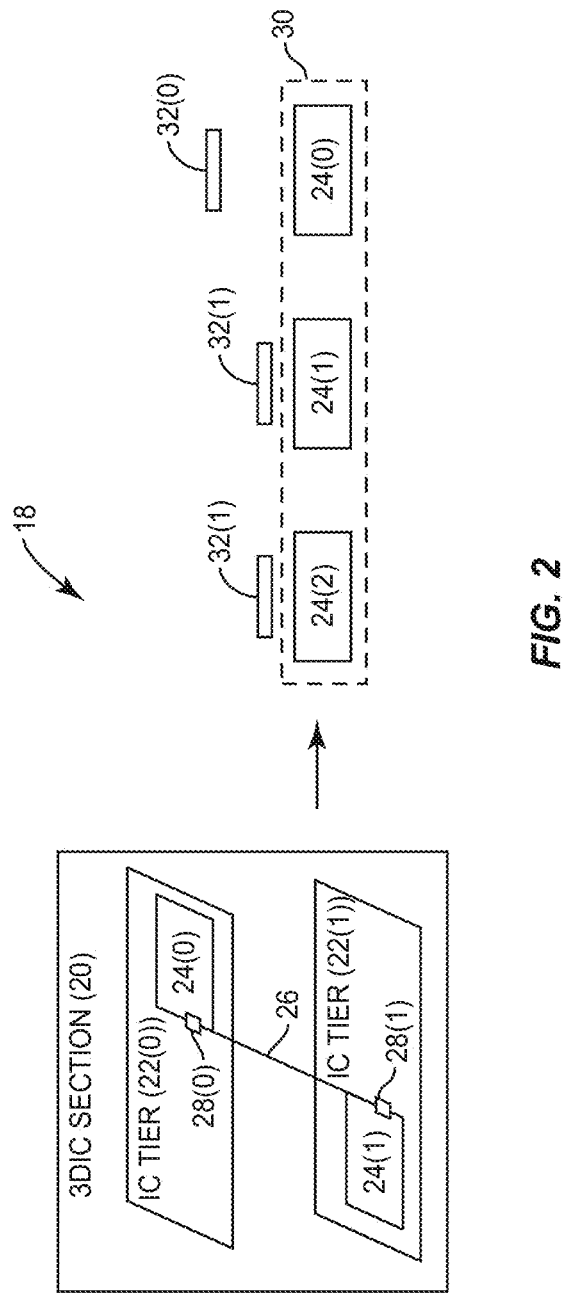
FIG. 2 is a diagram illustrating an exemplary method of customizing a two dimensional (2D) place and route (P&R) tool to perform 3D placement and routing within a monolithic 3DIC.

Prior to discussing the details of the clustering and aligning steps in blocks 14 and 16, respectively, in FIG. 1, an exemplary method of using a 2D P&R tool with 3D customizations, such as in block 12 in FIG. 1, is first described. In this regard, FIG. 2 illustrates an exemplary method 18 of customizing a 2D P&R tool to perform 3D placement and routing within a 3DIC. In this example, the 2D P&R tool is able to route pins existing on multiple metal layers within a 2DIC. More specifically, an exemplary 3DIC section 20 is comprised of two separate IC tiers 22(0)-22(1) (also referred to herein as "tiers 22(0)-22(1)"). Each tier 22(0)-22(1) includes a corresponding AND gate 24(0)-24(1), respectively. In order to connect the AND gate 24(0) to the AND gate 24(1) using an MIV, the 2D P&R tool must route an interconnect 26 that connects a pin 28(0) on the AND gate 24(0) to a pin 28(1) on the AND gate 24(1). In this manner, although the 2D P&R tool is programmed to provide the interconnect 26 to connect elements on a same placement layer 30 within a 2DIC, the interconnect 26 actually connects the tiers 22(0)-22(1) of the 3DIC section 20.

With continuing reference to FIG. 2, the 2D P&R tool is customized to perform the previously described routing for the 3DIC section 20 through netlist and layout exchange format (LEF) file manipulation. In particular, a 2D AND gate 24(2) is defined in the netlist and LEF files used by the 2D P&R tool. According to information within such files, the AND gate 24(2) may be placed within the placement layer 30 existing in a 2DIC, while using a first metal layer 32(1) for routing. In order to customize such entries in the files for 3D integration, the 3D versions of the AND gate 24(2) are used, which correspond to the AND gates 24(0)-24(1) previously described. More specifically, the AND gates 24(0)-24(1) are defined in the 2D P&R tool so that each may be placed on the same placement layer 30 within the 2DIC. However, in order to manipulate the 2D P&R tool into creating a 3DIC, the AND gate 24(0) is defined to use a metal layer 32(0) for routing, while the AND gate 24(1) is defined to use the metal layer 32(1). By assigning and routing each AND gate 24(0)-24(1) with a different metal layer 32(0)-32(1), respectively, a layout plan produced by the 2D P&R tool can appear to place each AND gate 24(0)-24(1) on a separate tier 22(0)-22(1), respectively, within the 3DIC.

Figure 3:
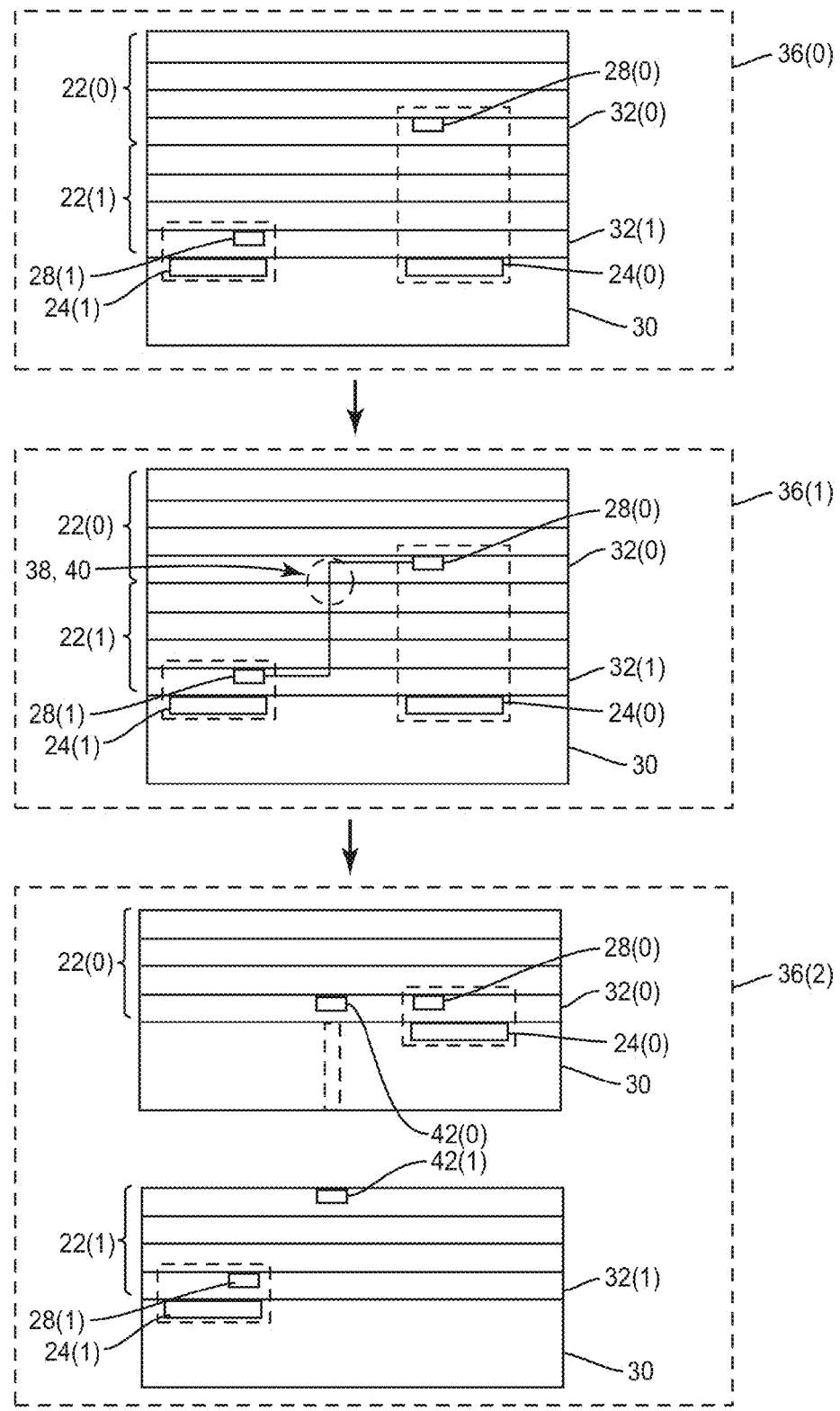
FIG. 3 is an exemplary diagram of cross-sections of a monolithic 3DIC illustrating MIVs placed and routed using the 2D P&R tool method in FIG. 2.

In this regard, FIG. 3 illustrates an exemplary diagram 34 of cross-sections 36(0)-36(2) of a monolithic 3DIC showing an MIV 38 placed and routed within the 3DIC section 20 using the method 18 previously described in FIG. 2. The diagram 34 includes certain common components with the method 18 in FIG. 2, which are shown with common element numbers between FIGS. 2 and 3.

With continuing reference to FIG. 3, the cross-section 36(0) illustrates the placement of components within the 3DIC section 20 following the 2D P&R tool using the manipulated LEF and netlist files as previously described. More specifically, the AND gates 24(0)-24(1) are placed within the placement layer 30. However, as shown in the cross-section 36(0), the pin 28(0) corresponding to the AND gate 24(0) is accessed using the metal layer 32(0). Conversely, the pin 28(1) corresponding to the AND gate 24(1) is accessed using the metal layer 32(1). As previously described, the AND gates 24(0)-24(1) are defined to be placed within the same placement layer 30, while using the metal layers 32(0)-32(1), respectively, for routing. In this manner, the pin 28(0) of the AND gate 24(0) is interpreted to exist on the tier 22(0), while the pin 28(1) of the AND gate 24(1) is interpreted to exist on the tier 22(1). Thus, the 3D customizations provided to the 2D P&R tool allow for the metal layers 32(0)-32(1) to be interpreted as the separate tiers 22(0)-22(1), respectively, within the 3DIC section 20.

With continuing reference to FIG. 3, the cross-section 36(1) illustrates the cross-section 36(0) after the 2D P&R tool has performed the routing function. In particular, the pin 28(0) has been routed to the pin 28(1) via the interconnect 26. The 2D P&R tool thus interprets the interconnect 26 in FIG. 2 (not shown in FIG. 3) to connect the AND gates 24(0)-24(1) through the respective pins 28(0)-28(1) using the metal layers 32(0)-32(1). However, rather than connecting the AND gates 24(0)-24(1) using the interconnect 26 in FIG. 2 (not shown in FIG. 3), the routing step provides a location 40 at which the MIV 38 will be initially placed. Specifically, the MIV 38 will initially be placed at the location 40 where the 2D P&R tool has routed across the metal layers 32(0)-32(1). Thus, as previously described, the method 18 in FIG. 2 manipulates the 2D P&R tool to route across multiple metal layers 32(0)-32(1), wherein the metal layers 32(0)-32(1) represent the tiers 22(0)-22(1) within the 3DIC section 20.

With continuing reference to FIG. 3, the cross-section 36(2) illustrates the 3DIC section 20 in FIG. 2 (not shown in FIG. 3) separated into the tiers 22(0)-22(1) following the routing step previously described with regard to the cross-section 36(1). More specifically, the tier 22(0) contains the AND gate 24(0) placed in the placement layer 30. Further, the pin 28(0) on the AND gate 24(0) is also provided within the tier 22(0). However, although the AND gate 24(1) and the pin 28(1) are also placed within the placement layer 30, the tier 22(1) is provided as existing separate from the tier 22(0) due to the 3D customizations previously described. In order to interconnect the AND gates 24(0)-24(1) between the tiers 22(0)-22(1) using the MIV 38, MIV landing pads 42(0)-42(1) are provided to each tier 22(0)-22(1), respectively. As a result, the tiers 22(0)-22(1) can be interconnected by connecting the MIV 38 to each respective MIV landing pad 42(0)-42(1) in order to create the 3DIC section 20 in FIG. 2 (not shown in FIG. 3) using the 2D P&R tool with 3D customizations. However, the placement of the MIV 38 within the 3DIC section 20 in FIG. 2 (not shown in FIG. 3) is performed without consideration of whitespace utilization within the 3DIC section 20. Thus, the method 18 described in FIG. 2 and illustrated in the diagram 34 in FIG. 3 places multiple MIVs within a 3DIC in a manner that can limit the amount of usable whitespace available for other design components, such as buffers used for timing optimization.

Figure 4:
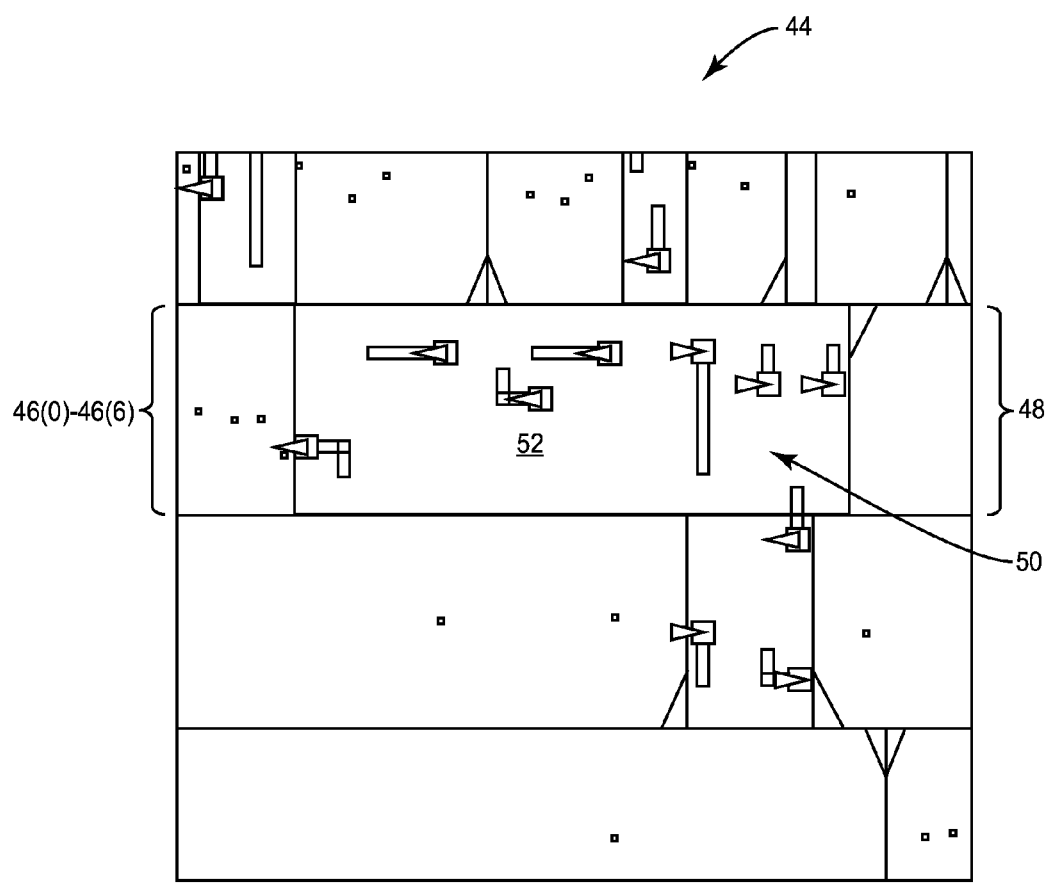
FIG. 4 is an exemplary layout design illustrating MIVs placed and routed using the 2D P&R tool method in FIG. 2, wherein the MIVs are scattered throughout a whitespace of a 3DIC.

In this regard, FIG. 4 illustrates an overhead view of an exemplary layout design 44 wherein MIVs 46(0)-46(6) have been placed and routed in a 3DIC standard cell row 48 using the method 18 previously described in FIG. 2 and illustrated in the diagram 34 in FIG. 3. While the layout design 44 contains placed and routed MIVs 46(0)-46(6) within the 3DIC standard cell row 48, such placing and routing could have alternatively been performed within a 3DIC standard cell column (not shown). More specifically, the 2D P&R tool places the MIVs 46(0)-46(6) without taking into account the location of the MIVs 46(0)-46(6) in relation to one another within a whitespace 50. Thus, the amount of the whitespace 50 available for use by other design components is limited. For example, the MIVs 46(1)-46(3) are placed so as to be staggered within the whitespace 50. In this manner, a portion 52 within the whitespace 50 is usable for other design components. However, as illustrated in FIG. 4, the portion 52 is only a small percentage of the total 3DIC standard cell row 48. Therefore, because the method 18 previously described scatters the placement of the MIVs 46(0)-46(6) and limits the whitespace 50 usable by other design components, a 3DIC having the layout design 44 cannot maximize its achievable performance.

Figure 5:
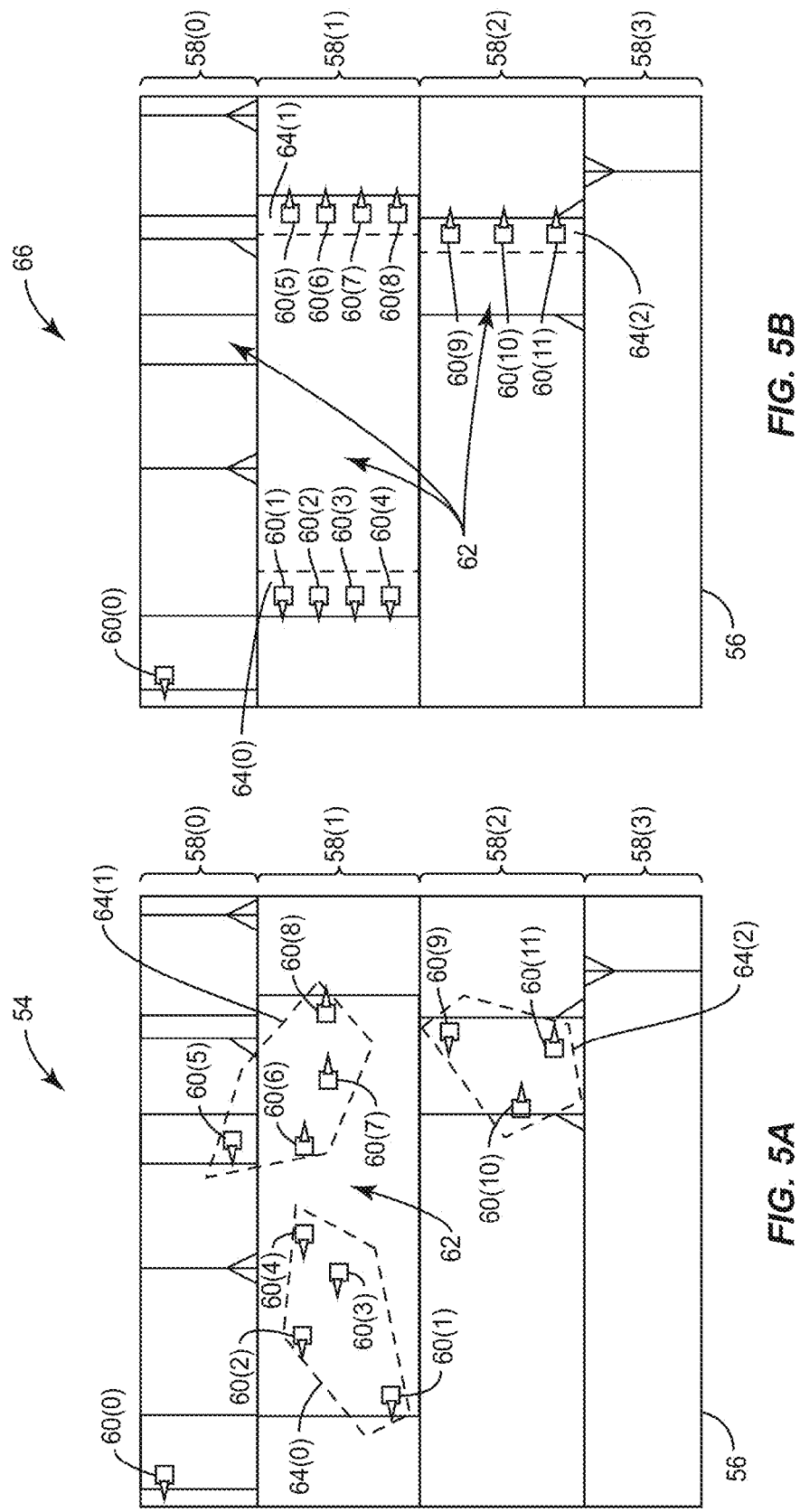
FIG. 5A is an exemplary layout diagram illustrating MIVs grouped into MIV placement clusters within a monolithic 3DIC after being initially placed by the 2D P&R tool method in FIG. 2.
FIG. 5B is an exemplary layout diagram illustrating the MIVs within the monolithic 3DIC in FIG. 5A, following alignment within the MIV placement clusters in order to increase the amount of usable whitespace within the monolithic 3DIC.

In this regard, FIGS. 5A-5B illustrate placement of MIVs using the method 10 previously described in FIG. 1. In particular, FIG. 5A illustrates an overhead view of an exemplary layout diagram 54. The layout diagram 54 of a 3DIC 56 is divided into standard cell rows 58(0)-58(3), wherein MIVs 60(0)-60(11) are placed. Using the method 10 previously described in FIG. 1, the 2D P&R tool with 3D customizations scatters the MIVs 60(0)-60(11) throughout a whitespace 62 within the 3DIC 56, thereby limiting the whitespace 62 usable by other design components. However, following the initial placement performed by the 2D P&R tool, the MIVs 60(0)-60(11) are grouped into MIV placement clusters 64(0)-64(2). The makeup of each MIV placement cluster 64(0)-64(2) may be determined, for example, by scanning the initial placements of the MIVs 60(0)-60(11) and grouping the MIVs 60(0)-60(11) that are initially placed within a certain radius into a particular MIV placement cluster 64(0)-64(2). For example, the MIVs 60(1)-60(4) are close in proximity to one another, and are thus grouped into the MIV placement cluster 64(0). However, the MIV 60(0) is not grouped into any of the MIV placement clusters 64(0)-64(2) because it is not placed within a certain radius of another MIV 60(1)-60(11).

In this regard, FIG. 5B illustrates an overhead view of an exemplary layout diagram 66. The layout diagram 66 includes certain common components with the layout diagram 54 in FIG. 5A, which are shown with common element numbers between FIGS. 5A and 5B. More specifically, following the grouping of the MIVs 60(1)-60(11) into the respective MIV placement clusters 64(0)-64(2), each MIV 60(1)-60(11) is aligned within its MIV placement cluster 64(0)-64(2). Aligning the MIVs 60(1)-60(11) within the respective MIV placement cluster 64(0)-64(2) provides each MIV 60(1)-60(11) with its final placement location within the 3DIC 56. As illustrated in the layout diagram 66, the alignment process results in a greater amount of usable whitespace 62, as compared to the layout diagram 54 in FIG. 5A. Thus, the greater amount of usable whitespace 62 in the layout diagram 66 provided by using the method 10 previously described in FIG. 1 provides more area in which to place other design components. In this manner, the achievable performance of the 3DIC 56 may be improved by allowing more whitespace 62 for design steps such as buffer insertion for timing optimization, or decoupling capacitor insertion for signal optimization.

Figure 6:
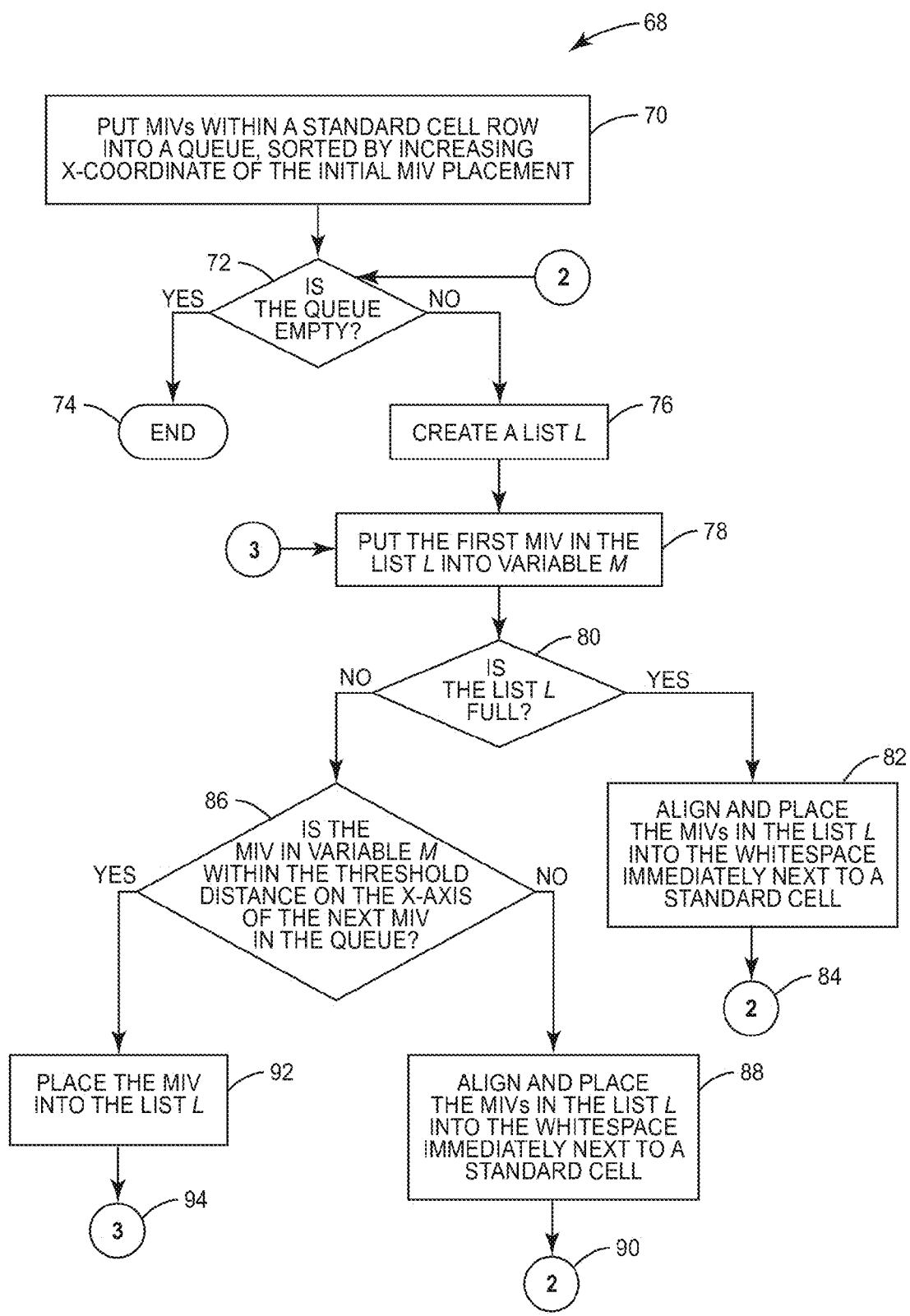
FIG. 6 is a flowchart illustrating an exemplary process for grouping MIVs within a monolithic 3DIC into MIV placement clusters and aligning the MIVs based on an x-coordinate of each MIV following its initial placement and a relative distance to a next closest MIV on the x-axis.

In this regard, FIG. 6 is a flowchart illustrating an exemplary process 68 for grouping MIVs within a monolithic 3DIC into placement clusters and aligning the MIVs based on an x-coordinate of each MIV following its initial placement and a relative distance to a next closest MIV on the x-axis. More specifically, the process 68 begins by putting MIVs placed within a defined section of a 3DIC, such as a standard cell row, into a queue. In this example, the MIVs are sorted within the queue in order of the increasing x-coordinate of the initial placement of each MIV (block 70). The process 68 next determines whether or not the queue is empty (block 72). If the queue is empty, meaning that the queue does not contain any MIVs, then the process 68 ends (block 74). However, if the queue contains one or more MIVs, the process 68 creates a list L (block 76). Once the list L is created, the first MIV in the queue is put into a variable M (block 78). Before proceeding, the process 68 determines whether or not the list L is full and unable to accommodate additional MIVs (block 80). If the list L is at full capacity, then the MIVs contained in the list L are aligned and placed within a whitespace immediately adjacent to an existing standard cell within the defined section of the 3DIC (block 82). In this manner, the list L is representative of an MIV placement cluster that may support a defined number of MIVs. After such alignment and placement of the MIVs at block 82, the process 68 returns to block 72 and again determines whether or not the queue is empty (block 84). Once the process 68 returns to block 72, the sequence of steps previously described repeats.

With continuing reference to FIG. 6, if the list L is not full at block 80, the process 68 determines whether the MIV in the variable M is currently placed within a defined threshold distance on the x-axis of the next MIV in the queue (block 86). The threshold distance used for the process 68 may be based on various considerations. As a non-limiting example, the threshold distance may be defined based on the standard cell dimensions used within the 3DIC. If the MIV in the variable M is not within the threshold distance of the next MIV within the queue at block 86, then the MIVs within the list L are aligned and placed into the whitespace immediately adjacent to an existing standard cell within the defined section of the 3DIC (block 88). Such an alignment and placement of the MIVs takes place at block 88 because the distance between the MIV in the variable M and the next MIV in the queue is determined to be large enough so as to make grouping the two MIVs within the same MIV placement cluster (represented as the list L) undesirable. After aligning and placing the MIVs at block 88, the process 68 returns to block 72 and determines whether the queue is empty, as previously described (block 90).

With continuing reference to FIG. 6, if it is determined that the MIV in the variable M is within the threshold distance of the next MIV in the queue at block 86, then the MIV is put into the list L (block 92). Once the MIV is added to the list L, the process 68 returns to block 78 to place the next MIV, if any, into the variable M (block 94). In this manner, the process 68 puts the MIVs contained within the defined section of the 3DIC, such as a standard cell row, into the queue. Using the iteration of steps previously described, the process 68 groups the MIVs into MIV placement clusters (represented by the list L) until either the MIV placement cluster is full or the distance on the x-axis between two consecutive MIVs necessitates the initiation of a new MIV placement cluster. The MIVs within each MIV placement cluster are aligned and placed into the whitespace within the defined section of the 3DIC. Further, the process 68 may be repeated multiple times for a single 3DIC in order to achieve potentially greater efficiency of MIV placement within the whitespace.

Figure 7A:
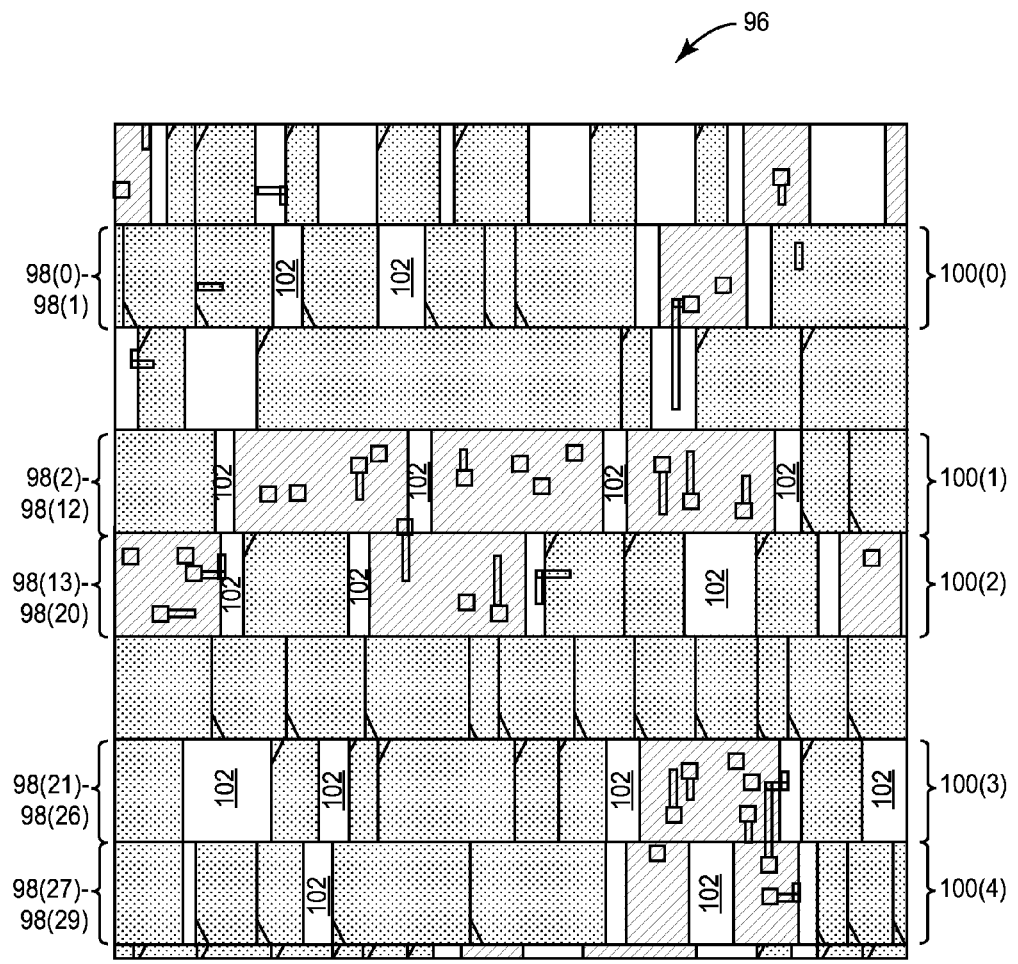
FIG. 7A is an exemplary layout design illustrating MIVs initially placed and routed using the 2D P&R tool method in FIG. 2.

In this regard, FIG. 7A illustrates an exemplary layout design 96 illustrating MIVs initially placed and routed using the method 18 previously described in FIG. 2. In particular, MIVs 98(0)-98(29) are placed within standard cell rows 100(0)-100(4), respectively. For example, the MIVs 98(0)-98(1) are placed on the standard cell row 100(0), the MIVs 98(2)-98(12) are placed on the standard cell row 100(1), the MIVs 98(13)-98(20) are placed on the standard cell row 100(2), the MIVs 98(21)-98(26) are placed on the standard cell row 100(3), and the MIVs 98(27)-98(29) are placed on the standard cell row 100(4). In this manner, the MIVs 98(0)-98(29) are scattered throughout a whitespace 102 of the layout design 96. Because the MIVs 98(0)-98(29) are spread out in this fashion, the amount of the whitespace 102 available for other components is limited. Thus, the achievable performance of a 3DIC fabricated using the layout design 96 may suffer due to an inability to efficiently employ other components within the whitespace 102.

Figure 7B:
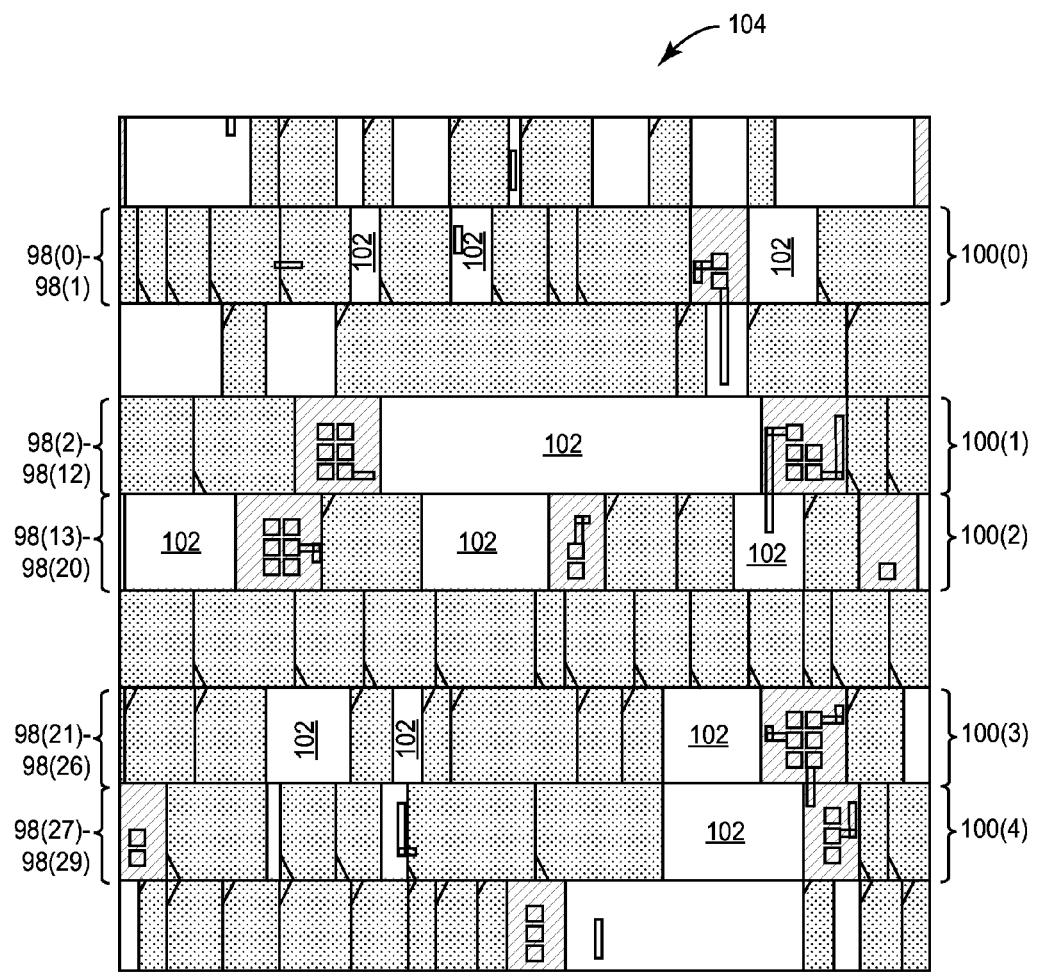
FIG. 7B is an exemplary layout design illustrating an increased amount of usable whitespace as a result of grouping MIVs within the layout design in FIG. 7A into MIV placement clusters and aligning the MIVs within the MIV placement clusters as described in FIG. 1.

In this regard, FIG. 7B illustrates an exemplary layout design 104 that is the result of applying the method 10 in FIG. 1 to the layout design 96 in FIG. 7A. The layout design 104 in FIG. 7B includes certain common components with the layout design 96 in FIG. 7A, which are shown with common element numbers between the figures. As evidenced by FIG. 7B, the method 10 in FIG. 1 provides an increased amount of usable whitespace 102 in the layout design 104, as compared to the layout design 96 in FIG. 7A. More specifically, the method 10 groups the MIVs 98(0)-98(29) within the layout design 96 into MIV placement clusters (not shown) and aligns the MIVs 98(0)-98(29) within such MIV placement clusters, as previously described. For example, the MIVs 98(0)-98(29) placed in the standard cell rows 100(0)-100(4) in the layout design 104 are aligned with respect to the y-axis within each MIV placement cluster, resulting in an increased amount of usable whitespace 102. Additionally, it is worth noting that the method 10 is effective at increasing the amount of usable whitespace 102 with MIV placement clusters of varying size. For example, placing and aligning the eleven (11) MIVs 98(2)-98(12) within an MIV placement cluster substantially increases the amount of usable whitespace 102 on the standard cell row 100(1), as compared to the same standard cell row 100(1) in the layout design 96 in FIG. 7A. Similarly, the method 10 also increases the amount of usable whitespace 102 on the standard cell row 100(0) by placing and aligning the two (2) MIVs 98(0)-98(1) within an MIV placement cluster. Therefore, the method 10 in FIG. 1 can increase the amount of whitespace 102 within the layout design 104 available to other components, such as buffer insertion for timing optimization. Such additional usable whitespace 102 can improve the performance, power consumption, and routing quality achieved within a 3DIC.

The placement of MIVs within monolithic 3DICs using clustering to increase usable whitespace according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
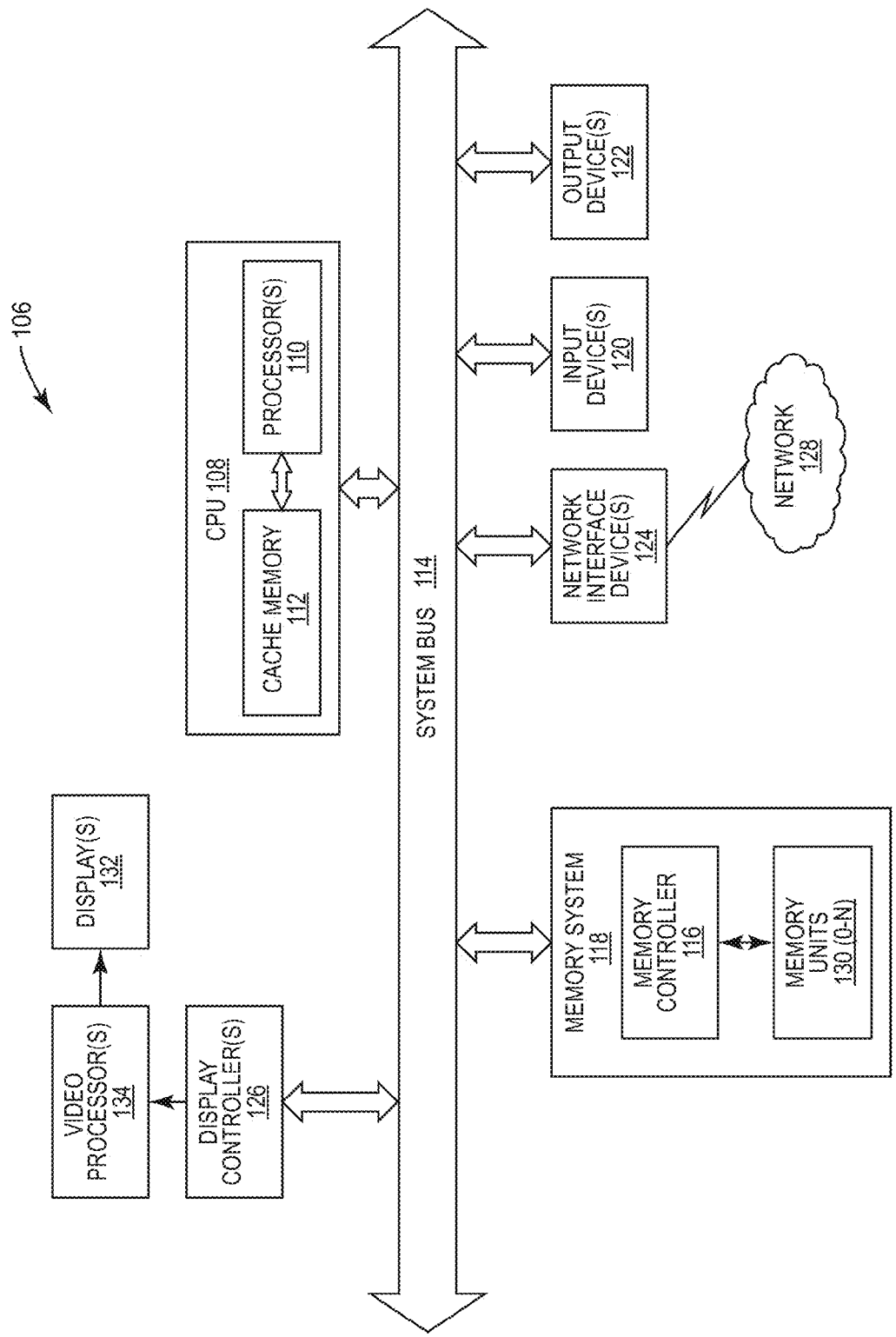
FIG. 8 is a block diagram of an exemplary processor-based system that can include monolithic 3DICs that employ the placement of MIVs using the method described in FIG. 1.

In this regard, FIG. 8 illustrates an example of a processor-based system 106 that can employ the method 10 illustrated in FIG. 1. In this example, the processor-based system 106 includes one or more central processing units (CPUs) 108, each including one or more processors 110. The CPU(s) 108 may have cache memory 112 coupled to the processor(s) 110 for rapid access to temporarily stored data. The CPU(s) 108 is coupled to a system bus 114 and can intercouple master and slave devices included in the processor-based system 106. As is well known, the CPU(s) 108 communicates with these other devices by exchanging address, control, and data information over the system bus 114. For example, the CPU(s) 108 can communicate bus transaction requests to a memory controller 116 as an example of a slave device. Although not illustrated in FIG. 8, multiple system buses 114 could be provided, wherein each system bus 116 constitutes a different fabric.

Other master and slave devices can be connected to the system bus 114. As illustrated in FIG. 8, these devices can include a memory system 118, one or more input devices 120, one or more output devices 122, one or more network interface devices 124, and one or more display controllers 126, as examples. The input device(s) 120 can include any type of input device, including but not limited to input keys, switches, voice processors, etc. The output device(s) 122 can include any type of output device, including but not limited to audio, video, other visual indicators, etc. The network interface device(s) 124 can be any devices configured to allow exchange of data to and from a network 128. The network 128 can be any type of network, including but not limited to a wired or wireless network, a private or public network, a local area network (LAN), a wide local area network (WLAN), and the Internet. The network interface device(s) 124 can be configured to support any type of communication protocol desired. The memory system 118 can include one or more memory units 130 (0-N).

The CPU(s) 108 may also be configured to access the display controller(s) 126 over the system bus 114 to control information sent to one or more displays 132. The display controller(s) 126 sends information to the display(s) 132 to be displayed via one or more video processors 134, which process the information to be displayed into a format suitable for the display(s) 132. The display(s) 132 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method of placing Monolithic Inter-tier Vias (MIVs) in a monolithic three dimensional (3D) integrated circuit (IC) (3DIC) using clustering, comprising:
    determining if any MIV placement clusters are included within a plurality of initial MIV placements of a plurality of MIVs within an initial 3DIC layout plan; and
    aligning each MIV of the plurality of MIVs within each MIV placement cluster in the initial 3DIC layout plan at a final MIV placement for each MIV placement cluster to provide a clustered 3DIC layout plan.

2. The method of claim 1, wherein determining if any of the MIV placement clusters are included within the plurality of initial MIV placements, comprises:
    scanning the plurality of initial MIV placements in the initial 3DIC layout plan; and
    providing an MIV placement cluster for each subset of the plurality of initial MIV placements placed within an MIV placement cluster radius in the initial 3DIC layout plan.

3. The method of claim 2, comprising providing the MIV placement cluster for each subset of the plurality of initial MIV placements placed within the MIV placement cluster radius of at least twenty (20) transistor gate pitches in the initial 3DIC layout plan.

4. The method of claim 2, comprising providing the MIV placement cluster for each subset of the plurality of initial MIV placements placed within the MIV placement cluster radius in the initial 3DIC layout plan, wherein each MIV placement cluster comprises a corresponding subset of the plurality of initial MIV placements having a total area equal to or less than an area of the corresponding MIV placement cluster.

5. The method of claim 1, wherein aligning each MIV within each MIV placement cluster comprises placing each MIV at a location that provides a usable whitespace within the clustered 3DIC layout plan larger than a usable whitespace within the initial 3DIC layout plan.

6. The method of claim 5, further comprising placing at least one buffer in the usable whitespace within the clustered 3DIC layout plan for timing optimization.

7. The method of claim 1, wherein the initial 3DIC layout plan further comprises a plurality of IC block placements for a plurality of IC blocks.

8. The method of claim 7, wherein each IC block of the plurality of IC blocks comprises a standard cell.

9. The method of claim 7, wherein each IC block of the plurality of IC blocks comprises an IC logic gate.

10. The method of claim 1, further comprising repeating the determining and aligning steps for a plurality of iterations for a monolithic 3DIC.

11. The method of claim 1, wherein determining if any of the MIV placement clusters are included within the plurality of initial MW placements comprises:
- placing the plurality of MIVs within a defined section of the initial 3DIC layout plan into a queue, wherein the plurality of MIVs are sorted within the queue based on an increasing x-coordinate of a corresponding initial MIV placement;
- determining if the queue is empty; and
- in response to determining that the queue is not empty, creating a list, wherein the list comprises the plurality of MIVs in the queue.

12. The method of claim 11, wherein determining if any of the MIV placement clusters are included within the plurality of initial MW placements further comprises:
- in response to creating the list, placing a first MW within the queue in a variable; and
- determining if the list is full.

13. The method of claim 12, wherein aligning each MIV of the plurality of MIVs within each MIV placement cluster in the initial 3DIC layout plan at the final MIV placement comprises:
- in response to determining that the list is full, aligning the plurality of MIVs in the list; and
- placing the plurality of MIVs in the list into a usable whitespace immediately or approximately immediately adjacent to an existing standard cell within the defined section of the initial 3DIC layout plan.

14. The method of claim 13, wherein aligning each MIV of the plurality of MIVs within each MIV placement cluster in the initial 3DIC layout plan at the final MIV placement further comprises:
- in response to determining that the list is not full, determining if the MIV in the variable is currently placed within a defined threshold distance on an x-axis of a next MIV in the queue;
- in response to determining that the MW in the variable is not currently placed within the defined threshold distance, aligning the plurality of MIVs in the list;
- placing the plurality of MIVs in the list into the usable whitespace immediately or approximately immediately adjacent to the existing standard cell within the defined section of the initial 3DIC layout plan; and
- determining if the queue is empty.

15. The method of claim 14, wherein aligning each MIV of the plurality of MIVs within each MIV placement cluster in the initial 3DIC layout plan at the final MIV placement further comprises:
- in response to determining that the MIV in the variable is currently placed within the defined threshold distance, placing the MIV in the variable into the list; and
- placing the first MIV in the list into the variable.

* * * * *

UNITED STATES PATENT AND TRADEMARK OFFICE
CERTIFICATE OF CORRECTION

PATENT NO. : 9,123,721 B2  
APPLICATION NO. : 14/132098  
DATED : September 1, 2015  
INVENTOR(S) : Kambiz Samadi et al.

Page 1 of 1

It is certified that error appears in the above-identified patent and that said Letters Patent is hereby corrected as shown below:

In The Claims  
Claim 1, at column 12, line 22, change "MW" to --MIV--.  
Claim 1, at column 12, line 26, change "MW" to --MIV--.  
Claim 2, at column 12, line 29, change "MW" to --MIV--.  
Claim 3, at column 12, line 37, change "MW" to --MIV--.  
Claim 4, at column 12, line 42, change "MW" to --MIV--.  
Claim 11, at column 13, line 3, change "MW" to --MIV--.  
Claim 12, at column 13, line 15, change "MW" to --MIV--.  
Claim 12, at column 13, line 16, change "MW" to --MIV--.  
Claim 14, at column 14, line 11, change "MW" to --MIV--.

Signed and Sealed this  
First Day of March, 2016

Michelle K. Lee  
*Director of the United States Patent and Trademark Office*